(12) United States Patent
Manson et al.

(10) Patent No.: US 11,218,023 B2
(45) Date of Patent: Jan. 4, 2022

(54) RECLOSER CONTROL FAST OPEN CIRCUIT DETECTION

(71) Applicant: Schweitzer Engineering Laboratories, Inc., Pullman, WA (US)

(72) Inventors: Scott M Manson, Moscow, ID (US); Craig Thompson, Palouse, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 291 days.

(21) Appl. No.: 16/435,822

(22) Filed: Jun. 10, 2019

(65) Prior Publication Data

US 2020/0389048 A1 Dec. 10, 2020

(51) Int. Cl.
*H02J 13/00* (2006.01)
*G01R 23/02* (2006.01)
*H02J 3/00* (2006.01)
*H02J 3/38* (2006.01)

(52) U.S. Cl.
CPC .......... *H02J 13/0017* (2013.01); *G01R 23/02* (2013.01); *H02J 13/00001* (2020.01); *H02J 3/001* (2020.01); *H02J 3/388* (2020.01)

(58) Field of Classification Search
CPC .. H02J 13/0017; H02J 13/00001; H02J 3/001; H02J 3/388; H02J 3/381; H02J 13/00002; H02J 2310/10; H02J 3/0012; G01R 23/02; H02H 3/46; H02H 3/027; H02H 3/07; Y02P 80/14; Y02E 40/70; Y04S 10/12

See application file for complete search history.

(56) References Cited

U.S. PATENT DOCUMENTS

| | | | |
|---|---|---|---|
| 6,845,333 B2 | 1/2005 | Anderson | |
| 9,478,378 B2 | 10/2016 | Kasztenny | |
| 2003/0080741 A1* | 5/2003 | LeRow | H02M 7/493 324/320 |
| 2007/0168161 A1* | 7/2007 | Vellore | G06Q 10/06 702/182 |

(Continued)

FOREIGN PATENT DOCUMENTS

WO 2013115908 8/2013

OTHER PUBLICATIONS

John Mulhausen, et .al. "Anti-Islanding Today, Successful Islanding in the Future" IEEE, May 27, 2010., Originally presented at the 36th Annual Western Protective Relay Conference, Oct. 2009.

*Primary Examiner* — Hal Kaplan
*Assistant Examiner* — Thai H Tran
(74) *Attorney, Agent, or Firm* — Bradley W. Schield (57) ABSTRACT

The present disclosure relates to a recloser control that detects islanding based on a continuous analysis of frequency and rate of change of frequency. For example, a recloser control may include protection circuitry that is communicatively coupled to a recloser. The recloser control may receive measurements of an electrical characteristic in an electric power delivery system. The recloser control may determine frequency (F) and a rate of change of frequency (ROCOF) based on the received measurements. The recloser control may detect islanding of a microgrid in the electric power delivery system based at least in part on F and ROCOF. The recloser control may send a signal to the recloser to trip the recloser based on the islanding of the microgrid.

14 Claims, 5 Drawing Sheets

(56) References Cited

U.S. PATENT DOCUMENTS

2010/0286838 A1* 11/2010 Guzman-Casillas ........................
                                                G01R 19/2513
                                                      700/293
2011/0004355 A1*  1/2011 Wang .................. H02J 13/0004
                                                      700/286
2011/0068631 A1*  3/2011 Roscoe ..................... H02J 3/38
                                                       307/69
2011/0115301 A1*  5/2011 Bhavaraju ................. H02J 3/38
                                                       307/86

* cited by examiner

RECLOSER CONTROL FAST OPEN CIRCUIT DETECTION

TECHNICAL FIELD

The present disclosure relates generally to reclosers in electric power systems and, more particularly, to a recloser control that detects an open circuit condition in an electric power system using a frequency (F) and rate of change of frequency (ROCOF).

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Some electric power delivery systems may include a microgrid that may provide electrical energy to various loads in the electric power delivery system. For example, these microgrids may operate connected to the macrogrid such that the loads from the microgrid use power from the macrogrid and/or the microgrid may provide power to loads on the macrogrid. However, the microgrid may continue to energize power lines to the macrogrid during an open circuit condition of the macrogrid. Because maintenance may be performed on the macrogrid to address the open circuit condition, there is a need in the field to detect open circuit conditions and to perform protective actions to prevent energizing power lines during such conditions.

In some embodiments, a recloser control may be electrically connected to a recloser at a point of common coupling (PCC) between the microgrid and the macrogrid. The recloser control may receive measurements of an electrical characteristic in an electric power delivery system, such as voltage measurements. The recloser control may determine a frequency (F) and a rate of change of frequency (ROCOF) based on the received measurements. The recloser control may detect the open circuit condition in the electric power delivery system based at least in part on the ROCOF and the F. The recloser control may send a signal to a recloser to trip the recloser based on detection of the open circuit condition in the electric power delivery system to disconnect the microgrid from the macrogrid, also referred to as islanding the microgrid. By electrically islanding the microgrid from the macrogrid at the PCC, the recloser control may prevent energizing power lines beyond the PCC. By preventing open circuit conditions in the macrogrid in which power lines are energized beyond the PCC (i.e., between the PCC and the macrogrid), the recloser control may allow maintenance or other operations on the macrogrid to be performed independent of the microgrid.

Figure 1:
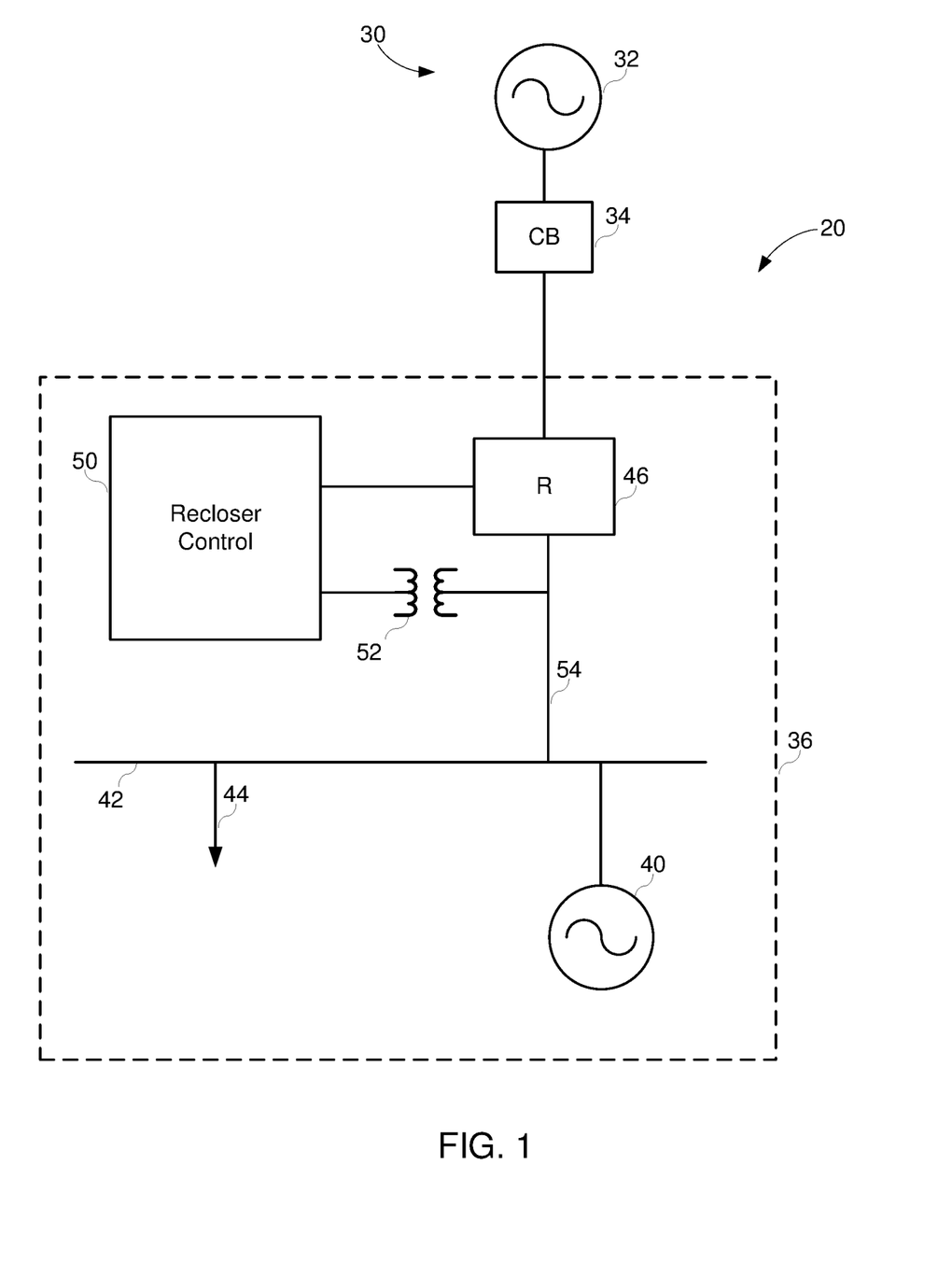
FIG. 1 is a one-line diagram of an electric power delivery system having a recloser control that operates a recloser at a point of common coupling (PCC) between a microgrid and a macrogrid, in accordance with an embodiment.

FIG. 1 illustrates a one-line diagram of an embodiment of an electric power delivery system, in accordance with an embodiment. The electric power delivery system includes a macrogrid 30, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the macrogrid includes a generator 32, representative of an electric utility, and a circuit breaker 34.

In the illustrated embodiment, the macrogrid is electrically connected to a microgrid 36. The microgrid 36 may include various electrical equipment as described above. As illustrated, the microgrid 36 includes a distributed generator 40, a bus 42, one or more loads 44, and a recloser 46. As mentioned above, the recloser 46 may be a point of common coupling (PCC) on a power line 54 between the microgrid 36 and the macrogrid 30. For instance, the recloser 46 may be located on an overhead power distribution line that enters the microgrid 36. The microgrid 36 may further include a recloser control 50 communicatively coupled to the recloser 46 to send control signals to the recloser 46. Further, the recloser control 50 may receive signal(s) from one or more sensors. For instance, the recloser control 50 may receive voltage signal(s) from a potential transformer 52 indicating the voltage of the power line 54.

The recloser control 50 may detect events on the power line 54 based on the voltage signals, current signals, and the like. For instance, a transient fault may occur on the overhead power distribution line of the recloser 46. The recloser control 50 may detect a transient event (e.g., overcurrent event, undercurrent event, overvoltage event, undervoltage event, etc.) and send a signal to the recloser 46 to open (i.e., trip) the recloser 46 and to subsequently close the recloser 46. For example, the recloser control 50 may be set to close the recloser 46 after a predetermined period of time to allow a transient fault to resolve. Further, the recloser control 50 may attempt to close and open a set amount of times prior to lock out in which the recloser remains in the open position, for example, until a user or another device communicates with the recloser control 50 to resume and close. By opening and closing the recloser 46 a set amount of times prior to lock out, the recloser control 50 may protect the electric power delivery system 20 from transient events without causing extended (e.g., times longer than the reclosing/lockout time) disruption of power delivery.

Figure 2:
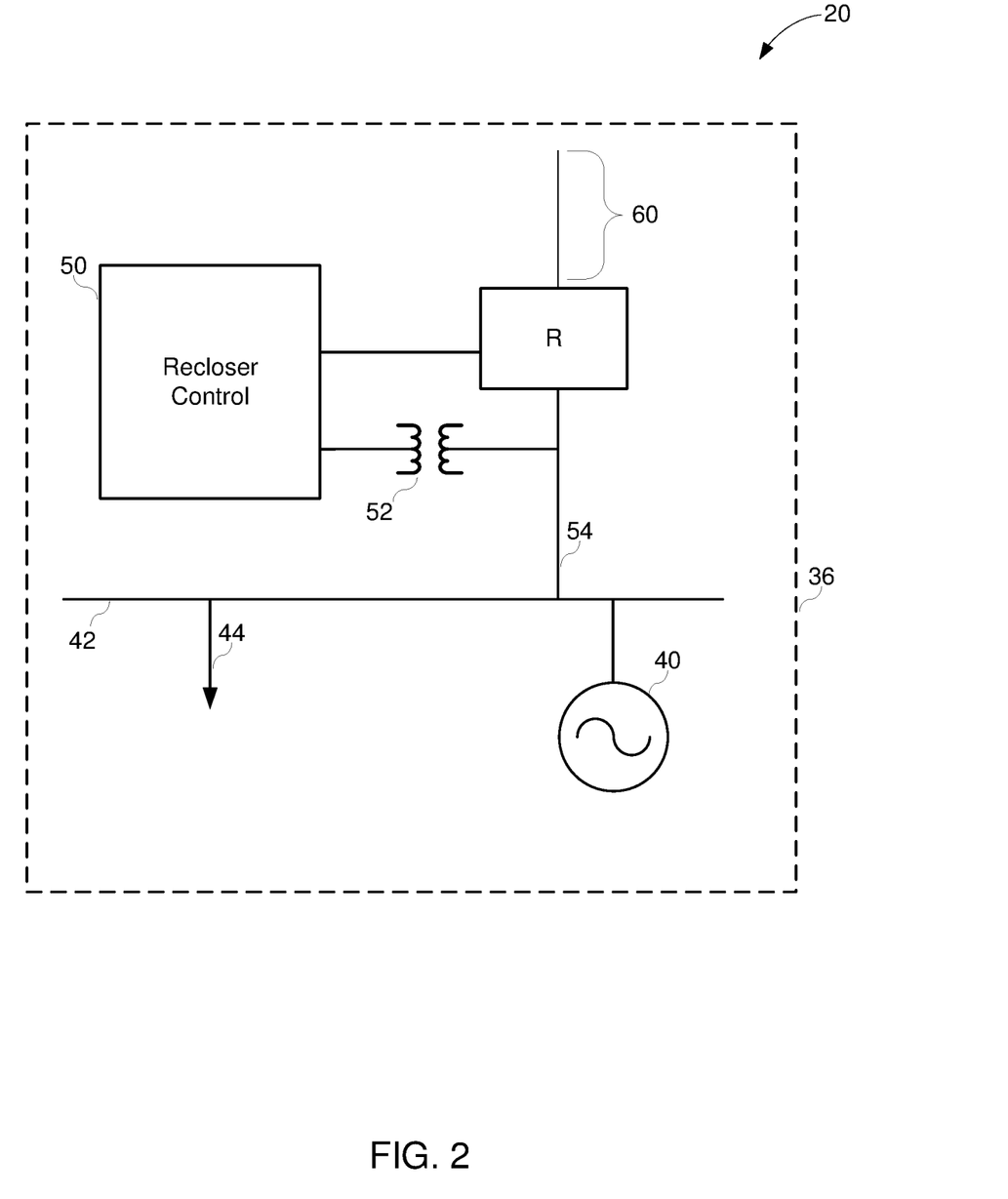
FIG. 2 is one-line diagram of the electric power delivery system of FIG. 1 having an open circuit condition on a power line between the recloser and the macrogrid, in accordance with an embodiment.

FIG. 2 is a one-line diagram of the electric power delivery system 20 in which an open circuit condition 60 is present on the power line 54, in accordance with an embodiment. Under the open circuit condition 60, the distributed generator 40 may continue to provide power to the one or more loads 44 of the microgrid 36. For example, this may allow prioritized loads to stay on-line during an event on the macrogrid 30. However, the distributed generator 40 may cause the power line 54 to remain energized to the macrogrid 30 because the PCC remains closed.

The open circuit condition of the macrogrid 30 may cause an increase or decrease in the ROCOF. For example, due to the changes in generation and/or changes in loads caused by the open circuit condition, the frequency of the voltages in the microgrid 36 may decrease or increase. In the illustrated example, shedding generation from the macrogrid 30 may cause a decrease in the ROCOF which may then cause a decrease in the F. For instance, the decrease in the F may be caused by the generator 40 in the microgrid 36 supporting the loads 44 in the microgrid 36 without supplemental power from the macrogrid 30.

Figure 3:
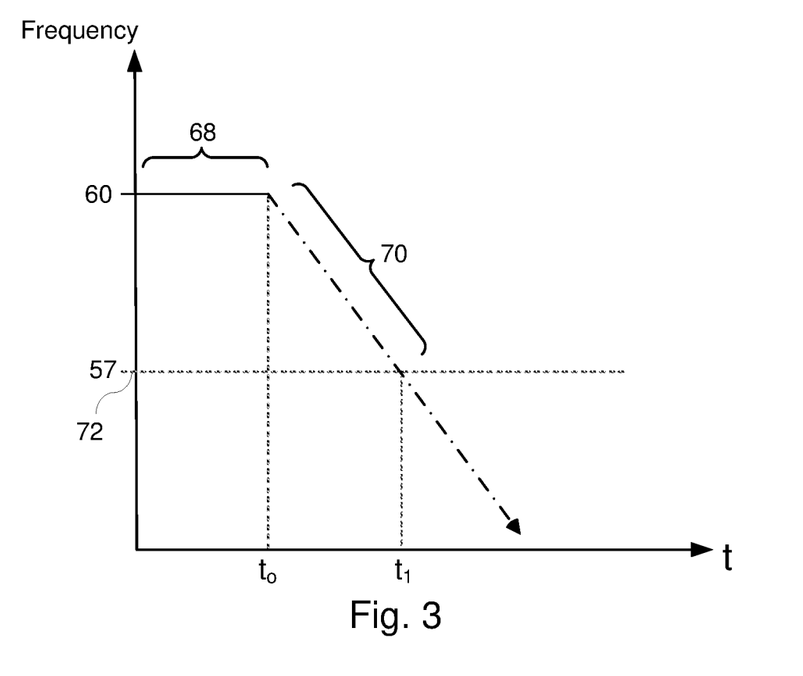
FIG. 3 is a plot of frequency with respect to time following the open circuit condition of the recloser of FIG. 2, in accordance with an embodiment.

FIG. 3 is a plot of the F with respect to time from the voltages obtained by the recloser control 50 via the potential transformer 52. As illustrated, the F 68 may be relatively stable during operation. At time t0, the macrogrid 30 is electrically disconnected from the microgrid 36 causing a ROCOF (dF/dt) in the voltages on the microgrid 36 in which the F 70 begins decreasing. If the F 70 continues to decrease beyond a threshold 72, a protective action may be taken to shed loads in the power delivery system 20 to prevent outages in the microgrid 36.

Figure 4:
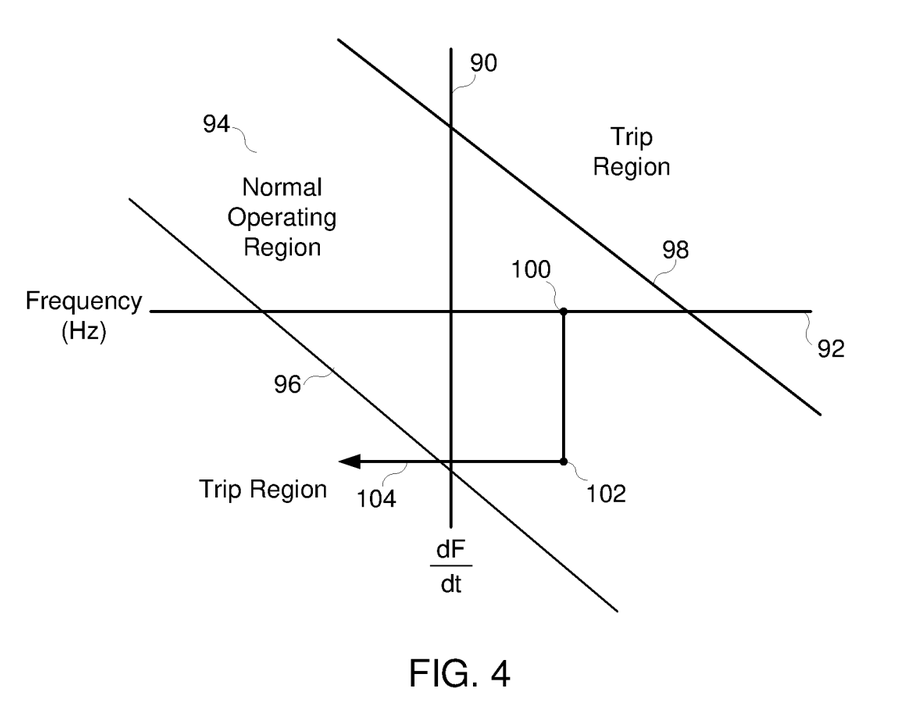
FIG. 4 is a plot of a rate of change of frequency with respect to frequency following the open circuit condition of FIG. 2, in accordance with an embodiment.

FIG. 4 is a plot of the ROCOF 90 with respect to the F 92 of the example in FIG. 3. While the macrogrid 30 is connected, the F 100 may be relatively stable (e.g., as compared to when generation from the macrogrid 30 is disconnected). At time t0, the recloser control 50 may detect an increase or decrease in a ROCOF 102 of the voltages in the microgrid 36. In this example, the recloser control 50 may dynamically adjust a set point of the F based on the ROCOF. That is, a lower set point 96 and/or a higher set point 98 of the F may be updated based on the ROCOF to detect open circuit conditions of the electric power delivery system 20. If the operating F and the ROCOF fall below or exceed the normal operating region 94, the recloser control 50 may perform a protection operation on the electric power delivery system 20. For instance, the recloser control 50 may open the recloser 46 to prevent electrical energy from being provided beyond the PCC toward the macrogrid 30 to reduce energy consumption by the microgrid 36 and to prevent power lines from being energized upstream to the macrogrid 30.

Figure 5:
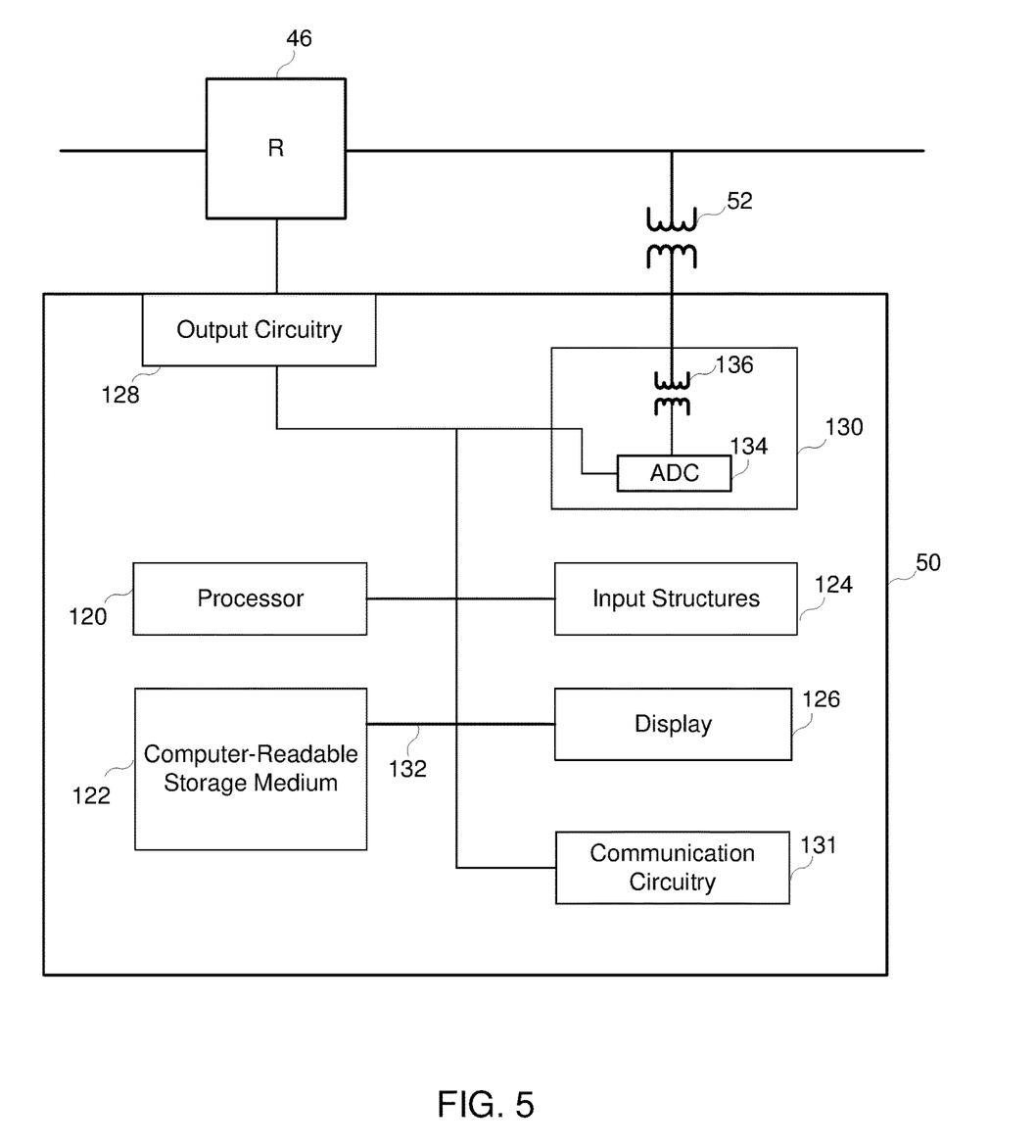
FIG. 5 is a block diagram of the recloser control of FIG. 1, in accordance with an embodiment.

FIG. 5 is a block diagram of an embodiment of the recloser control 50 that may trip the recloser 46 based on the ROCOF to disconnect the PCC between the microgrid 36 and the macrogrid 30 to island the microgrid and prevent charging of power lines to the macrogrid 30. In the illustrated embodiment, the recloser control 50 includes a processor 120, a computer-readable storage medium 122, input structures 124, a display 126, output circuitry 128, sensor circuitry 130, and communication circuitry 131.

The recloser control 50 may include one or more bus(es) 132 connecting the processor 120 or processing unit(s) to the computer-readable storage medium 122, the input structures 124, the display 126, the output circuitry 128, and/or the sensor circuitry 130. The computer-readable storage medium 122 be embodied as memory, such as random access memory (RAM), read only memory (ROM), or a combination thereof, and may include or interface with software, hardware, or firmware modules for implementing various portions of the systems and methods described herein. The computer-readable storage medium 122 may be the repository of one or more modules and/or executable instructions configured to implement any of the processes described herein.

The processor 120 may process inputs received via the sensor circuitry 130 and the communication circuitry 56. The processor 102 may operate using any number of processing rates and architectures. The processor 102 may be configured to perform various algorithms and calculations described herein using computer executable instructions stored on computer-readable storage medium 122. The processor 120 may be embodied as a microprocessor. In certain embodiments, the processor 120 and/or the computer-readable storage medium 122 may be embodied as discrete electrical components, a general purpose integrated circuit, one or more Application Specific Integrated Circuits ("ASICs"), a Field Programmable Gate Array ("FPGA"), and/or other programmable logic devices. The processor 120 and/or the computer-readable storage medium 122 may be referred to generally as processing circuitry.

The sensor circuitry 130 may include voltage sensor circuitry, such as a potential transformer 52. The sensor circuitry 130 may receive voltage signals from the voltage transformer 52 and transform the signals using the potential transformer(s) 136 to a level that may be sampled, and sample the signals using, for example, A/D converter(s) 134 to produce digital signals representative of measured voltage on the power line 54. Similar values may also be received from other distributed controllers, station controllers, regional controllers, or centralized controllers. The values may be in a digital format or other format. In certain embodiments, the sensor circuitry 130 may be utilized to monitor current and/or voltage signals associated with a portion of an electric power delivery system 20. Further, the sensor circuitry 130 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 134 may be connected to the processor 120 by way of the bus 132, through which digitized representations of voltage signals may be transmitted to the processor 120. As described above, the processor 120 may be used to monitor and/or protect portions of the electric power delivery system 20, and issue control instructions in response to the same (e.g., instructions implementing protective actions).

The output circuitry 128 may include one or more output connectors (e.g., output contacts) that electrically connect the recloser control 50 to the recloser 46 to allow the processor 120 to send control signals to the recloser 46. For example, the output circuitry 128 may convert bus signals from the processor 120 to a voltage and/or current to open or close the recloser 46.

The communication circuitry 131 may include, for example, a wireless transceiver that communicates with one or more other IEDs, a central monitoring station, and the like. The recloser control 50 may include a display screen 126 that displays information to notify an operator of events on the electric power delivery system 20, such as open circuit conditions. In certain embodiments, the processor 120 may effect a control operation on the electric power delivery system 20 via the protection circuitry 128, as described above. For example, the processor 120 may send a signal to open the recloser 46 upon detecting islanding of the microgrid 36 to disconnect the power line 56 between the PCC and the macrogrid 30.

Figure 6:
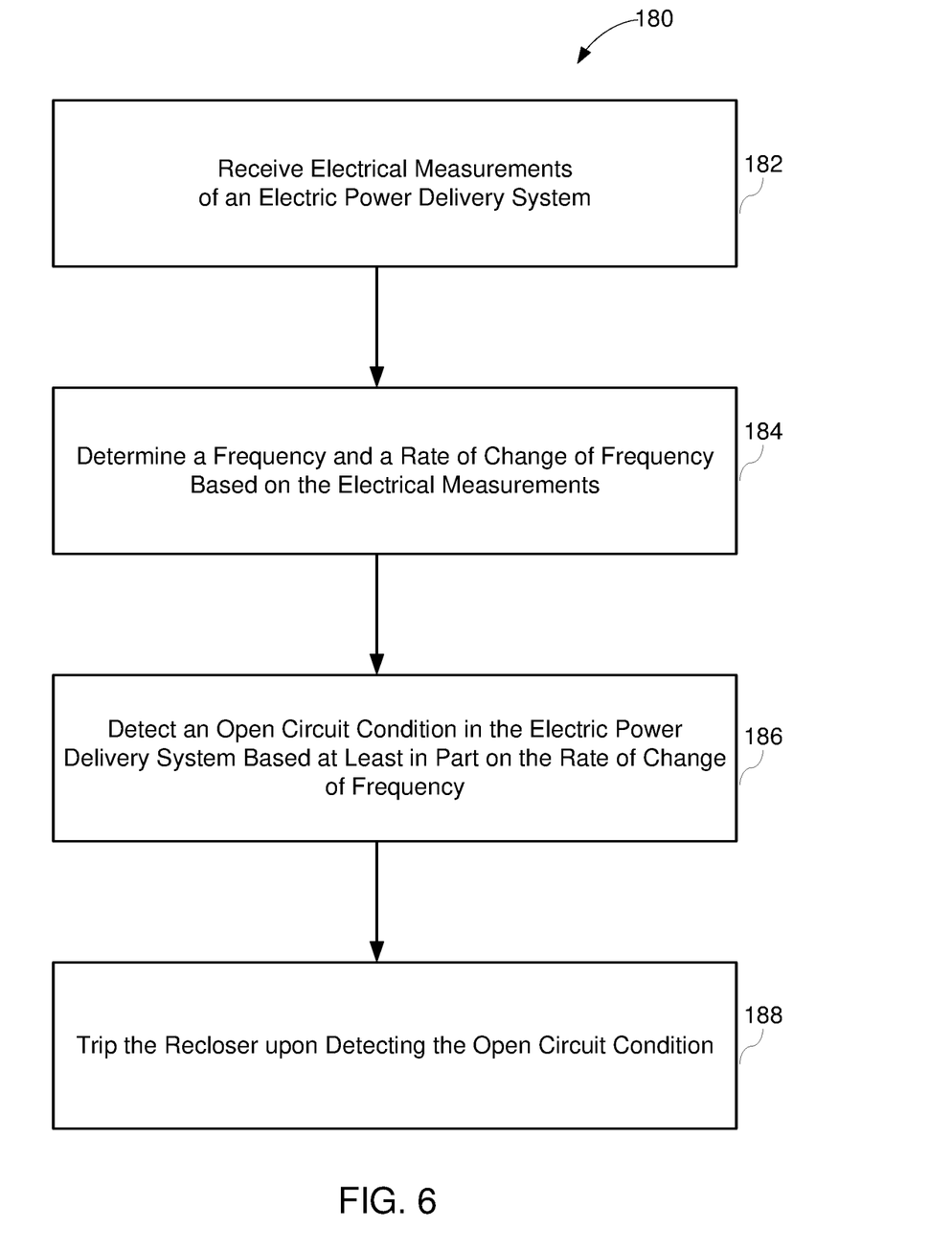
FIG. 6 is a flow diagram of a process that may be performed by the recloser control to prevent energizing of the power line beyond the recloser upon detecting the open circuit condition of FIG. 2, in accordance with an embodiment.

FIG. 6 is a flow diagram of a process that may be performed by the processor 120 of the recloser control, in accordance with an embodiment. The process 180 may be stored as instructions (e.g., code) on the computer-readable medium 122 to be executed by the processor 120 of the recloser control 50. The process 180 may begin by receiving electrical measurements of an electric power delivery system. For example, the processor 120 may receive voltage measurements via the potential transformer 52 indicating the voltages on the power line 54.

The processor 120 may determine F and ROCOF (dF/dt) based on the electrical measurements (block 184). For example, the processor 120 may determine the F of the voltages by counting zero crossings of voltages within a given period of time. From counting the zero crossings, the processor 120 may determine changes in the rate at which the zero crossings occur to determine the ROCOF. While zero crossings are used as an example, any suitable method of determining the F and the ROCOF may be used. By using the ROCOF, open circuit conditions of the microgrid may be detected at time to prior to the F threshold of protective actions at time ti.

The processor 120 may detect an open circuit condition of the electric power delivery system 20 based on the ROCOF and F (block 186). As shown in FIG. 4, if the processor 120 determines that the F and/or the ROCOF fall into a trip region below the set point 96 or above the set point 98, the processor 120 may determine that an open circuit condition has occurred. The processor 120 may dynamically adjust the set point based on the ROCOF. For instance, a faster decrease or increase in the ROCOF may be more likely to indicate an open circuit condition.

While ROCOF is used here as an example, alternatively and/or additionally, vector shifts may be used to quickly detect islanding conditions. For example, ROCOF calculations may be used to dynamically set vector shift thresholds, or vector shift calculations may be used to dynamically set F and/or ROCOF thresholds. Vector shifts calculations may include calculating a period of each phase voltage and detecting a change in the period measurement. Note that, while frequency is described in detail herein, similar processes may be performed using period, as period is inversely related to F.

The processor 120 may then send a signal to open the recloser upon detecting the open circuit condition to island the microgrid 36 to prevent energized power lines beyond the PCC of the electric power delivery system 20 (block 188). In some embodiments, the recloser control 50 may lock out the recloser 46 in which the recloser does not automatically attempt close operations. In certain embodiments, the recloser control 50 may open the recloser 46 and wait for a remote distribution automation (DA) control signal before sending a close signal to close the recloser 46. For example, the recloser control 50 may receive, via the communication circuitry 131, a DA control signal indicating that the microgrid may reconnect to the macrogrid. The DA control signal may be sent via a central monitoring station.

The recloser control 50 may receive settings related to operations performed by the recloser control 50 upon detecting an open circuit condition in the electric power delivery system. For example, during commissioning (e.g., during communicatively coupling of the recloser control 50 with the recloser 46), the recloser control 50 may display, on the display screen 126, a list of protective actions that may be taken upon detecting islanding of a recloser, such as waiting until receiving a remote DA control signal after opening the recloser, locking out the recloser, waiting a predetermined period of time to reclose, or a combination thereof. The recloser control 50 may receive a user selection of the protective action to be taken upon detecting the open circuit condition. The recloser control 50 may then perform the selected protective action upon detecting the open circuit condition. Further, the recloser control 50 may receive a user input of set points 96 and 98 (e.g., sizes/slopes of the regions) that cause the recloser control 50 to detect the open circuit condition upon falling below or exceeding the set points 96 and 98.

Systems and methods may improve recloser operations and functionality by opening a recloser upon detecting open circuit conditions in an electric power delivery system. For example, a recloser control may determine ROCOF and F based on voltage measurements in the electric power delivery system. The ROCOF and F may quickly detect open circuit conditions of a microgrid from an event on a macrogrid. By detecting the open circuit conditions, the recloser control may island the microgrid to prevent energized power lines between the point of common coupling and the macrogrid.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A recloser control, comprising:
    an output connector configured to communicatively couple the recloser control to a recloser at a point of common coupling (PCC) between a microgrid and a macrogrid in an electric power delivery system;
    a memory; and
    a processor operatively coupled to the memory, wherein the processor is configured to execute instructions stored on the memory to cause the recloser control to:
        display a list of potential actions to be taken upon detecting open circuit conditions, wherein the list comprises a potential action to wait until receiving a remote distribution automation (DA) control signal after opening the recloser;

receive a user selection of a selected action to be taken upon detecting open circuit conditions from the list of potential protective actions;

receive measurements of an electrical characteristic in the electric power delivery system;

determine a rate of change of frequency (ROCOF) and frequency (F) based on the received measurements;

detect an open circuit condition based on the ROCOF and the F;

send a signal to the recloser to trip the recloser to prevent energization of power lines between the microgrid and the macrogrid based on the open circuit condition detected using the ROCOF and the F; and upon detecting the open circuit condition and tripping the recloser, due to the user selection, waiting to receive the remote DA control signal to close the recloser to reconnect the macrogrid to the microgrid.

2. The recloser control of claim 1, wherein the processor is configured to execute instructions stored on the memory to cause the recloser control to send the signal to trip the recloser to disconnect the PCC to prevent energizing of the power line to the open circuit condition while the microgrid is islanded.

3. The recloser of claim 1, wherein the processor is configured to execute instructions stored on the memory to cause the recloser control to:

receive a user setting to lock out closing of the recloser upon detecting the open circuit condition in the electric power delivery system; and locking out the recloser from automatically closing upon detecting the open circuit condition when the user setting of lock out is selected.

4. The recloser control of claim 1, wherein the processor is configured to execute instructions stored on the memory to cause the recloser control to dynamically adjust a set point of the F based on the ROCOF.

5. The recloser control of claim 4, wherein the processor is configured to execute instructions stored on the memory to cause the recloser control to trip the recloser when the F of the electric power delivery system decreases below the dynamically adjusted set point.

6. The recloser control of claim 5, wherein the processor is configured to execute instructions stored on the memory to cause the recloser control to trip the recloser when the F of the electric power delivery system increases beyond the dynamically adjusted set point.

7. A non-transitory, computer readable medium comprising instructions that, when executed by a processor, cause the processor to perform operations comprising:

display a list of potential actions to be taken upon detecting open circuit conditions, wherein the list comprises a potential action in which the recloser control waits until receiving a remote distribution automation (DA) control signal after opening the recloser;

receive a user selection of a selected action to be taken upon detecting open circuit conditions from the list of potential protective actions;

receiving measurements of an electrical characteristic at a point of common coupling (PCC) between a microgrid and a macrogrid of an electric power delivery system;

determining a rate of change of frequency (ROCOF) and a frequency (F) based on the received measurements;

detecting an open circuit condition based at least in part on the ROCOF and the F;

sending a signal to a recloser at the PCC to open the recloser based on the open circuit condition detected using the ROCOF and F to prevent energizing of a power line between the microgrid and the macrogrid; and upon detecting the open circuit condition and tripping the recloser, waiting to receive the remote DA control signal to close the recloser due to the user selection.

8. The non-transitory, computer readable medium of claim 7, comprising instructions that, when executed by the processor, cause the processor to perform operations comprising dynamically adjusting a first set point and a second set point of the F based on the ROCOF.

9. The non-transitory, computer readable medium of claim 8, comprising instructions that, when executed by the processor, cause the processor to perform operations comprising tripping the recloser when the F of the electric power delivery system decreases below the first set point.

10. The non-transitory, computer readable medium of claim 8, comprising instructions that, when executed by the processor, cause the processor to perform operations comprising tripping the recloser when the F increases beyond the second set point.

11. The non-transitory, computer readable medium of claim 7 wherein the list comprises a potential action of locking out the recloser after detecting islanding of the microgrid.

12. A method of commissioning a recloser control in an electric power delivery system, comprising:

communicatively coupling the recloser control with a recloser at a point of common coupling (PCC) between a microgrid of the electric power delivery system and a macrogrid of the electric power delivery system;

selecting, from a list of potential actions to be taken upon detecting open circuit conditions, a potential action in which the recloser control waits until receiving a remote distribution automation (DA) control signal after opening the recloser; and setting the recloser control to send a signal to open the recloser upon detecting an open circuit condition in the electric power delivery system to prevent energization of a power line between the microgrid and the macrogrid and to, upon detecting the open circuit condition and tripping the recloser, waiting to receive the remote DA control signal to close the recloser due to the user selection.

13. The method of claim 12, comprising setting the recloser control to detect the open circuit condition of the microgrid based on a rate of change of frequency (ROCOF) and a frequency (F).

14. The method of claim 12, wherein the list comprises locking out the recloser and waiting a predetermined period of time to reclose.

* * * * *